(12) United States Patent
Hussain et al.

(10) Patent No.: US 11,569,391 B2
(45) Date of Patent: Jan. 31, 2023

(54) SILICON NANOTUBE, FIELD EFFECT TRANSISTOR-BASED MEMORY CELL, MEMORY ARRAY AND METHOD OF PRODUCTION

(71) Applicant: KING ABDULLAH UNIVERSITY OF SCIENCE AND TECHNOLOGY, Thuwal (SA)

(72) Inventors: Muhammad Mustafa Hussain, Hercules, CA (US); Nazek Mohamad El-Atab, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 82 days.

(21) Appl. No.: 16/772,012

(22) PCT Filed: Dec. 17, 2018

(86) PCT No.: PCT/IB2018/060202
§ 371 (c)(1),
(2) Date: Jun. 11, 2020

(87) PCT Pub. No.: WO2019/123216
PCT Pub. Date: Jun. 27, 2019

(65) Prior Publication Data
US 2021/0091235 A1 Mar. 25, 2021

Related U.S. Application Data

(60) Provisional application No. 62/618,218, filed on Jan. 17, 2018, provisional application No. 62/608,706, filed on Dec. 21, 2017.

(51) Int. Cl.
*H01L 29/792* (2006.01)
*H01L 29/66* (2006.01)
(Continued)

(52) U.S. Cl.
CPC .... *H01L 29/7926* (2013.01); *H01L 27/11582* (2013.01); *H01L 29/66833* (2013.01); *H01L 29/7831* (2013.01)

(58) Field of Classification Search
CPC ........... H01L 29/7926; H01L 27/11582; H01L 29/66833; H01L 29/7831; H01L 29/0847;
(Continued)

(56) References Cited

U.S. PATENT DOCUMENTS 9,224,813 B2* 12/2015 Hussain ............ H01L 29/66484
10,103,159 B2* 10/2018 Tan ..................... H01L 29/7831
(Continued)

FOREIGN PATENT DOCUMENTS

WO 2012118568 A2 9/2012
WO 2012119053 A1 9/2012

OTHER PUBLICATIONS

Chen, P.C.Y., "Threshold-Alterable Si-Gate MOS Devices," IEEE Transactions on Electron Devices, May 1977, vol. ED-24, No. 5, pp. 584-586.
(Continued)

*Primary Examiner* — Shahed Ahmed
*Assistant Examiner* — Khatib A Rahman
(74) *Attorney, Agent, or Firm* — Patent Portfolio Builders PLLC

(57) ABSTRACT

A memory cell includes a substrate and a body including plural layers. The body has an inner body and an outer body, and the body is formed on top of the substrate. A nanotube trench is formed vertically in the body and extends to the substrate. A nanotube structure is formed in the nanotube trench. The nanotube trench divides the body into the inner body and the outer body and the nanotube structure is
(Continued)

mechanically separated from the inner body and the outer body by a tunnel oxide layer, a charge trapping layer, and a blocking oxide layer.

15 Claims, 8 Drawing Sheets

(51) Int. Cl.
  *H01L 29/08* (2006.01)
  *H01L 27/11582* (2017.01)
  *H01L 29/78* (2006.01)

(58) Field of Classification Search
  CPC ........... H01L 27/11563; H01L 29/0684; H01L 29/1033; H01L 29/66484; H01L 29/7827
  See application file for complete search history.

(56) References Cited

U.S. PATENT DOCUMENTS

2016/0099254 A1* 4/2016 Park .............. H01L 27/11565
  257/324
2018/0095821 A1* 4/2018 Vogt .................. G06F 11/1076

OTHER PUBLICATIONS

Fahad, H.M., et al., "Silicon Nanotube Field Effect Transistor with Core-Shell Gate Stacks for Enhanced High-Performance Operation and Area Scaling Benefits," Nano Letters, Sep. 16, 2011, vol. 11, pp. 4393-4399.

International Search Report in corresponding/related International Application No. PCT/IB2018/060202, dated Mar. 21, 2019.

Written Opinion of the International Searching Authority in corresponding/related International Application No. PCT/IB2018/060202, dated Mar. 21, 2019.

* cited by examiner

SILICON NANOTUBE, FIELD EFFECT TRANSISTOR-BASED MEMORY CELL, MEMORY ARRAY AND METHOD OF PRODUCTION

CROSS-REFERENCE TO RELATED APPLICATIONS

This application is a U.S. National Stage Application of International Application No. PCT/162018/060202, filed on Dec. 17, 2018, which claims priority to U.S. Provisional Patent Application No. 62/608,706, filed on Dec. 21, 2017, entitled "NANOTUBE FIELD EFFECT TRANSISTOR BASED MEMORY DEVICE," and U.S. Provisional Patent Application No. 62/618,218, filed on Jan. 17, 2018, entitled "NANOTUBE FIELD EFFECT TRANSISTOR BASED MEMORY DEVICE," the disclosures of which are incorporated herein by reference in their entirety.

BACKGROUND

Technical Field

Embodiments of the disclosed subject matter generally relate to a silicon nanotube, field effect-transistor-based memory cell, memory array, and method of production, and more specifically to a silicon nanotube, field effect-transistor-based memory cell having charge trapping layer surrounding a vertically arranged nanotube.

Discussion of the Background

In the past decade, memory chips with high density, low power consumption and low cost have gained more attention due to the growing market of consumer electronic equipment. This demand has further increased with the explosion of Internet of Things (IoT) and wearable devices technology. However, the energy budget of many IoT devices still remains a design challenge and requires a variety of energy saving strategies.

One way to lower the energy budget is to lower the standby current, which can be achieved using non-volatile memory (NVM), which can be completely powered down and still retain all of the information it stores. Although the scaling of flash memory devices has provided higher density chips with lower power consumption, scaling charge trapping memory (CTM)-based flash memory devices below the 32-nm technology node is becoming more difficult due to different unsolved problems such as short channel effect, drain induced barrier lowering (DIBL), and sub-surface punch-through effect which cause high leakage currents.

Aggressive downscaling of conventional non-volatile memory, particularly NOR-based charge trapping memory, can result in interference between adjacent memory cells due to the charge storage layers and control gates of neighbor memory cells affecting the coupling capacitance of a victim memory cell and causing a variation in the victim memory cell's threshold voltage ($\Delta V_T$). The increased cell-to-cell parasitic capacitance aggravates the variation in the victim memory cell's threshold voltage during read operation because the charge storage layer of a neighbor memory cell can affect the inversion layer of a victim memory cell. Moreover, the scaling of the tunnel oxide thickness is limited by concerns for reliability issues where a thin oxide leads to back-tunneling and leakage of stored charges, and therefore, a poor retention characteristic is exhibited.

Additionally, the speed gap between logic and memory (typically referred to as the "memory wall") has become a critical system performance bottleneck. Accordingly, a significant amount of research is currently being conducted on non-charge-type non-volatile memory such as resistive switching memory (ReRAM), phase change memory and ferroelectric memory, etc. and industry has already started using them in specific applications. However, resistive switching memory are still not sufficiently developed to be able to compete with the storage densities and non-volatility of charge-based memory devices. Further, resistive switching memory has its own limitations and integration challenges. For example, resistive switching memory, which has been studied for several years to replace NAND, has shown a lower read latency and a faster write performance than Flash which makes it promising for specific applications such as IoT. Additionally, resistive switching memory relies on exotic materials, which make its integration more complicated and in some cases its reliability and performance fall short of promise.

Thus, it would be desirable to provide a memory cell structure addressing short channel effects, coupling ratio, lithography, crosstalk between cells etc. exhibited by conventional planar non-volatile memory cells.

SUMMARY

In an embodiment, there is a memory cell, which includes a substrate and a body including plural layers. The body has an inner body and an outer body, and the body is formed on top of the substrate. A nanotube trench is formed vertically in the body and extends to the substrate. A nanotube structure is formed in the nanotube trench. The nanotube trench divides the body into the inner body and the outer body and the nanotube structure is mechanically separated from the inner body and the outer body by a tunnel oxide layer, a charge trapping layer, and a blocking oxide layer.

In another embodiment, there is a method of forming a memory cell. A body is formed on a substrate. The body comprises plural layers. A nanotube trench is formed vertically into the body to separate the body into an outer body and inner body. A blocking oxide layer is formed in the nanotube trench. A charge trapping layer is formed adjacent to the blocking oxide layer in the nanotube trench. A tunnel oxide layer is formed adjacent to the charge trapping layer in the nanotube trench. Portions of the blocking oxide layer, charge trapping layer, and tunnel oxide layer that are on the substrate in the nanotube trench are removed. A nanotube structure is formed adjacent to the tunnel oxide layer in the nanotube trench by forming a source region on the substrate, forming a channel region on the source region, and forming a drain region on the channel region.

In a further embodiment, there is a memory, which includes a memory controller arranged on a substrate and a plurality of memory cells arranged in an array on the substrate and electrically coupled to the memory controller. Each of the plurality of memory cells comprises a body including plural layers. The body is formed on top of the substrate. A nanotube trench is formed vertically in the body and extends to the substrate. A nanotube structure is formed in the nanotube trench. The nanotube trench divides the body into an inner body and an outer body and the nanotube structure is mechanically separated from the outer body by a tunnel oxide layer, a charge trapping layer, and a blocking oxide layer.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a field effect transistor-based nanotube memory cell. However, the embodiments discussed herein are not limited to this transistor but may be applied to other transistors.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
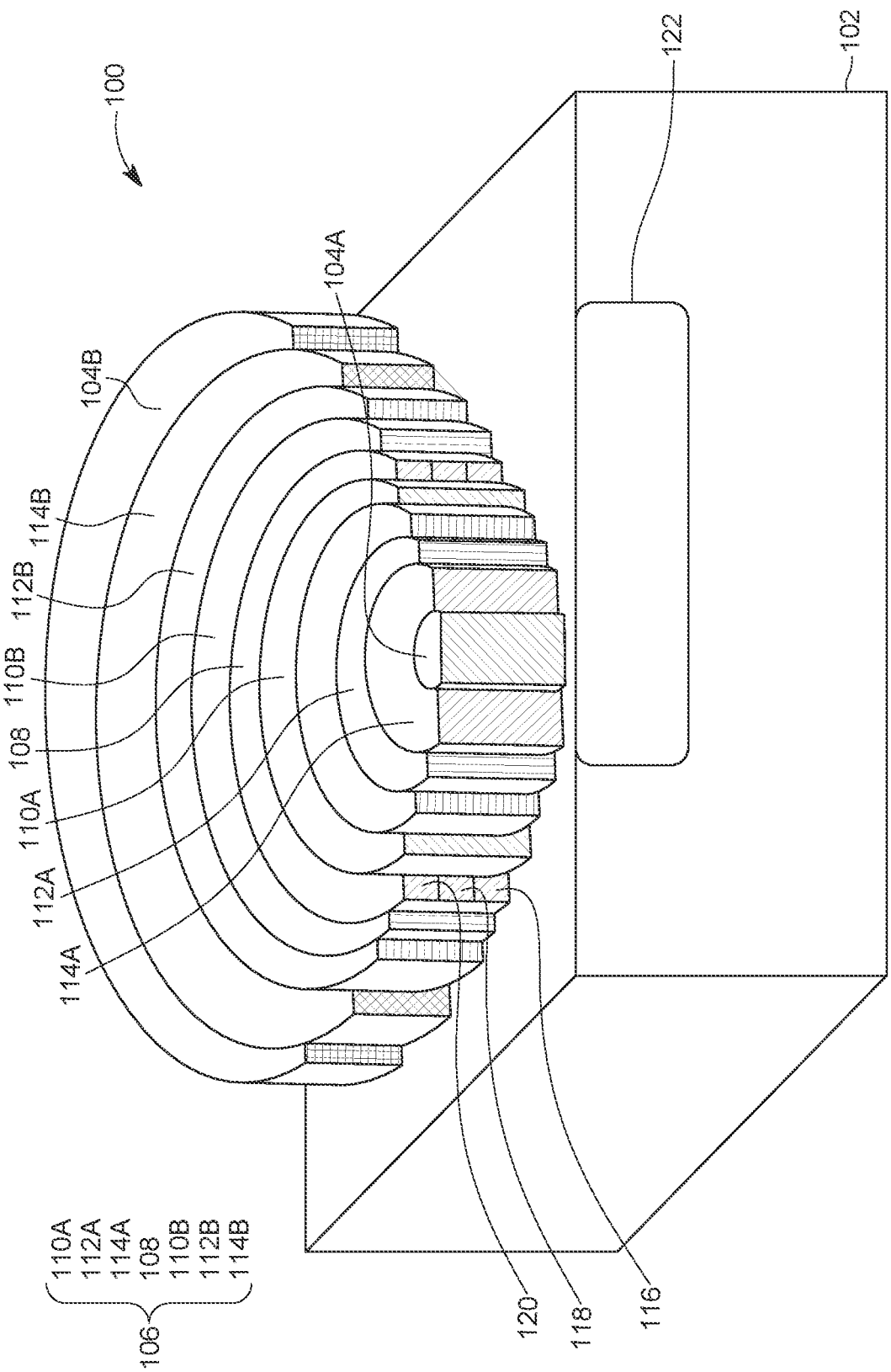
FIG. 1A illustrates a three-dimensional cross-section of a nanotube field effect transistor memory cell according to embodiments.

FIG. 1A illustrates a three-dimensional cross-section of a nanotube field effect transistor memory cell according to embodiments. The memory cell 100 includes a substrate 102. A body 104A and 104B, including plural layers, is formed on top of the substrate 102. The body includes an inner body 104A and an outer body 104B. A nanotube trench 106 is formed vertically in the body 104A and 104B and extends to the substrate 102. A nanotube structure 108 is formed in the nanotube trench 106. The nanotube trench divides the body into the inner body 104A and the outer body 104B. The nanotube structure 108 is mechanically separated from the outer body 104B by a tunnel oxide layer 110A and 110B, a charge trapping layer 112A and 112B, and a blocking oxide layer 114A and 114B. The tunnel oxide layer 110A and 110B and the blocking oxide layer 114A and 114B can comprise high-K dielectric oxides. The charge trapping layer 112A and 112B can comprise, for example, hafnium oxide ($HfO_2$), zinc oxide (ZnO), nanoparticles (of zinc oxide, silicon, or other semiconductor material), graphene nanoplatelets, etc.

As will be appreciated from the discussion below in connection with the method of forming the memory cell 100, although there are two cylindrical structures forming each of the tunnel oxide layer 110A and 11B, a charge trapping layer 112A and 112B, and a blocking oxide layer 114A and 114B, these two cylindrical structures are each referred as "a layer" because these structures are formed at the same time, i.e., structures 110A and 110B are formed in the same step, structures 112A and 112B are formed in the same step, and structures 114A and 114B are formed in the same step.

Thus, as will be appreciated from FIG. 1A, the tunnel oxide layer 110 is arranged between the charge trapping layer 112 and the nanotube structure 108 and the blocking oxide layer 114 are arranged between the charge trapping layer 112 and the outer body 104B. More specifically, the tunnel oxide layer 110 vertically surrounds the nanotube structure 108, the charge trapping layer 112 vertically surrounds the tunnel oxide layer 110, and the blocking oxide layer 114 vertically surrounds the charge trapping layer 112.

The nanotube structure 108 includes a source region 116 formed on the substrate 102, a channel region 118 formed on the source region 116, and a drain region 120 formed on the channel region 118. In the memory cell 100 illustrated in FIG. 1A, the inner body 104A forms a core gate of the silicon nanotube field effect transistor and the outer body 104B forms a shell gate of the silicon nanotube field effect transistor. The core gate and shell gate are used to control the number of carriers passing from the source region 116 through the channel region 118 to the drain region 120. It should be noted that the size of the source regions 116, channel region 118, and drain region 120 are in the nanometer range. The substrate 102 can be, for example, a silicon substrate that includes a heavily doped well 122 arranged beneath the nanotube structure 108. In other embodiments, the substrate can be a germanium substrate including the heavily doped well 122.

Figure 1B:
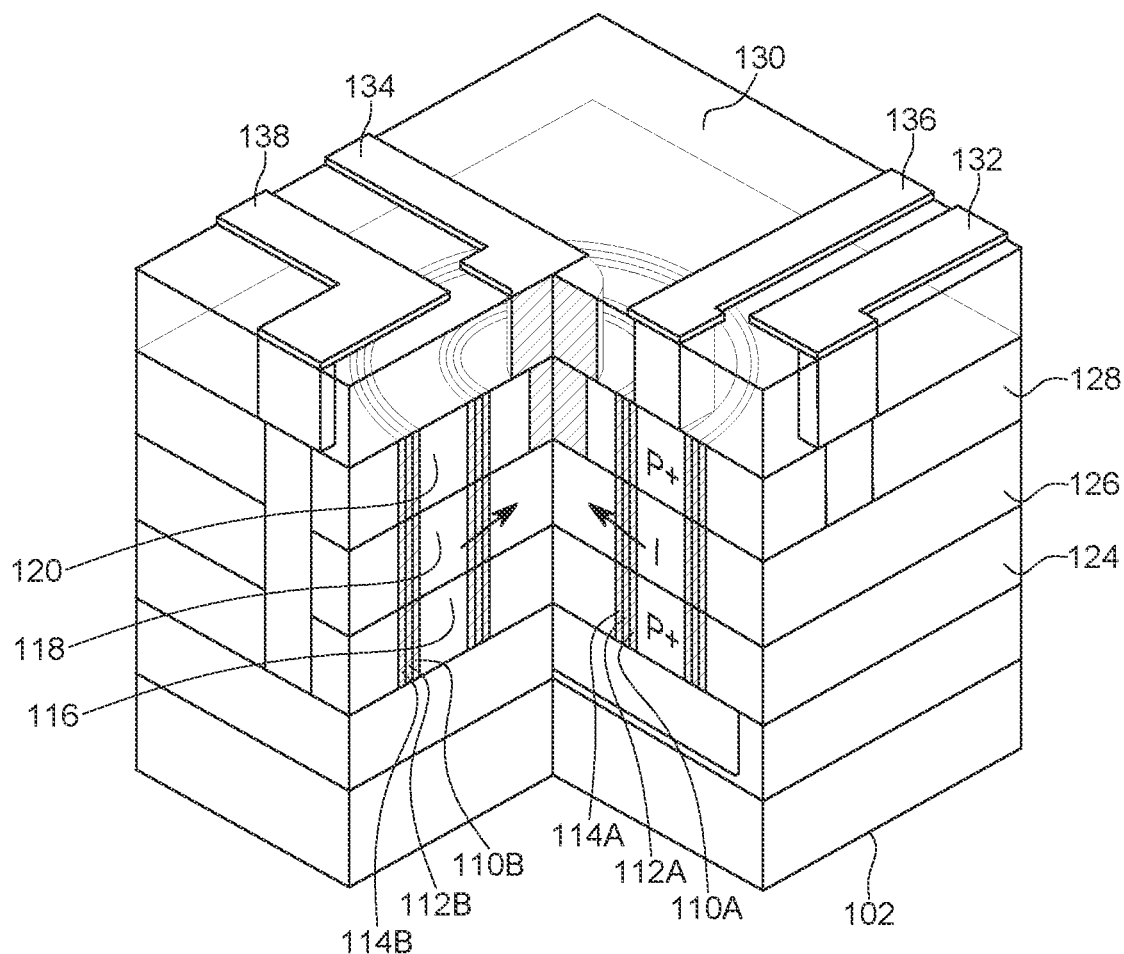
FIG. 1B illustrates a three-dimensional cross-section of a nanotube field effect transistor memory cell according to embodiments.

Turning now to FIG. 1B, which illustrates the memory cell of FIG. 1A being encapsulated in a protective layer and with the metallic contacts, as well as the plural layers of the body 104. Specifically, the body 104, including the inner body 104A and outer body 104B, includes a first dielectric layer 124 arranged on the substrate 102, a polysilicon layer 126, which functions as the gate layer, is arranged on the first dielectric layer 124, and a second dielectric layer 128 arranged on the polysilicon layer 126. The tops of the nanotube structure 108, the tunnel oxide layer 110A and 11B, the charge trapping layer 112A and 112B, the blocking oxide layer 114A and 114B, and the second dielectric layer 128 are covered by a protective layer 130.

A shell gate contact 132 passes through the protective layer 130 so that it is electrically coupled to the shell gate 104B. A core gate contact 134 passes through the protective layer 130 so that it is electrically coupled to the core gate 104A. Also, not illustrated in FIG. 1B but is illustrated in the method description below, the core gate contact 134 is electrically coupled to the shell gate contact 132. A drain contact 136 passes through the protective layer 130 so that it is electrically coupled to the nanotube structure 108. A source contact 138 passes through the protective layer 130 so that it is electrically coupled to highly doped well 122 of the substrate 102.

Figure 2:
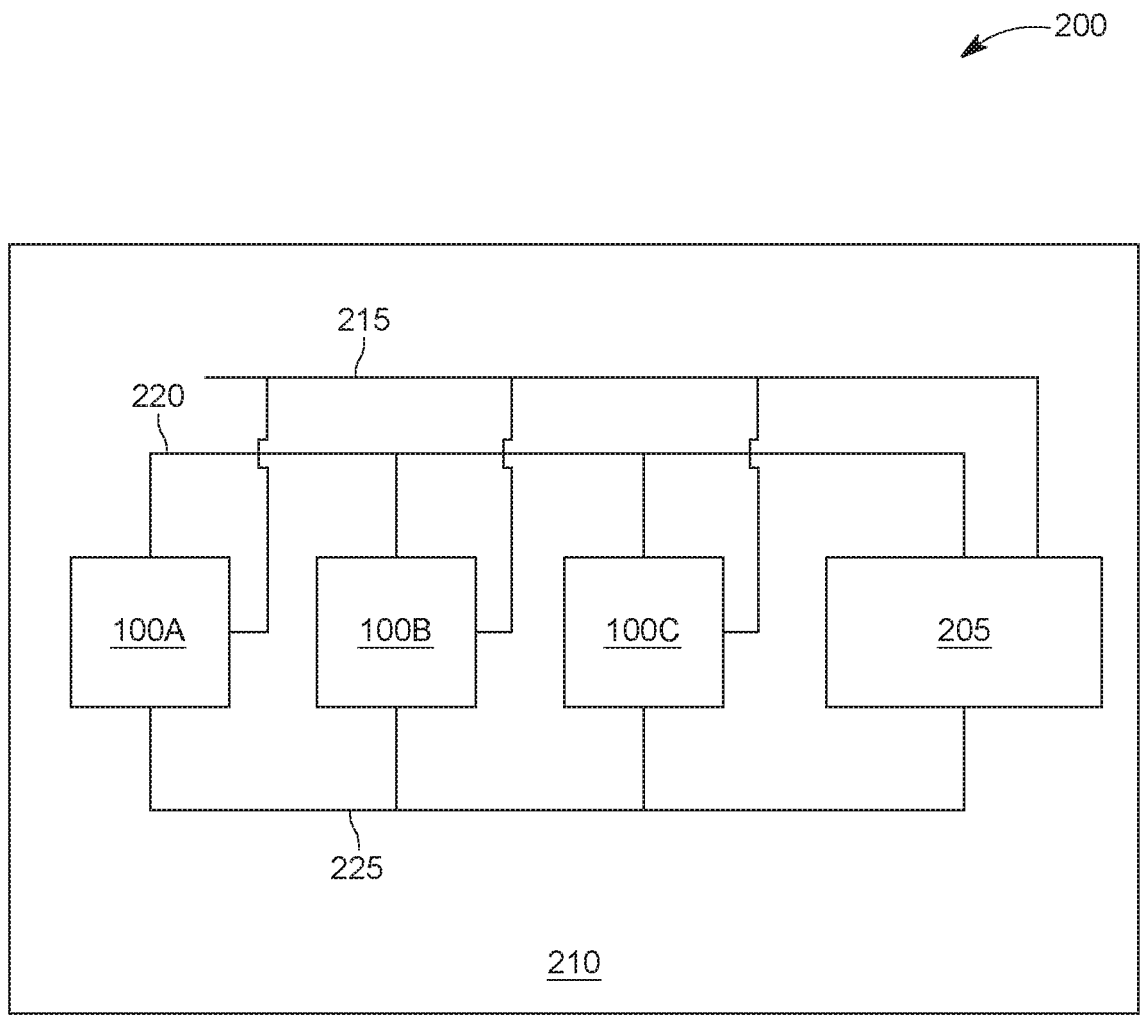
FIG. 2 illustrates a memory comprising an array of nanotube field effect transistor memory cells according to embodiments.

FIG. 2 illustrates a memory 200 having an array of nanotube field effect transistor memory cells according to embodiments. The memory cell array includes a plurality of memory cells 100A-100C electrically coupled to a memory controller 205, which is an art recognized term referring to a structure for controlling the reading from and writing to memory cells. The plurality of memory cells 100A-100C and the memory controller 205 are arranged on a common substrate 210. The plurality of memory cells 100A-100C can be formed on the common substrate 210 and the memory controller 205 can be formed on the common substrate 210 or formed separately and then transferred to the common substrate 210. The gate contacts of each of the memory cells 100A-100C are coupled to a gate line 215, the source contacts of the memory cells 100A-100C are coupled to a source line 220, and the drain contacts of the memory cells 100A-100C are coupled to the drain line 225. The gate line 215, source line 220, and drain line 225 are also coupled to the memory controller 205. A processor (not illustrated) can also be formed on the common substrate 210, which is particularly advantageous because the memory array would be an on-chip memory, which is faster than off-chip memories because it allows for wide memory buses and lower latencies. This has a direct impact on energy savings as active processing cycles are reduced and standby processing cycles are prolonged.

For ease of illustration, FIG. 2 illustrates a memory cell array 200 with three memory cells. It will be recognized, however, that the memory cell array 200 can include more than three memory cells 100 and the memory cells can be arranged in a two-dimensional matrix arrangement (or any other two-dimensional arrangement) instead of the linear arrangement illustrated in FIG. 2.

A method for forming a memory cell will now be described in connection with the flowchart of FIG. 3 and the diagrams of FIGS. 4A-4G. This method is a highly compatible CMOS process and offers several key potential advantages:

(i) The device channel length ($L_g$) is defined by the thickness of the deposited material enabling the formation of ultra-short channel devices. Such a process is immune to bottlenecks due to lithographic constraints and the shortest gate length is defined by the minimum thickness of the deposited material. Atomic layer deposited gate materials can be theoretically used to achieve sub-nm gate length devices.

(ii) The nanotube thickness can be controlled by the deposited gate dielectric thickness allowing ultra-narrow width nanotube FETs. Initial nanotube trenches can be defined using conventional lithography. Using high-κ gate dielectric enables the use of thick materials while maintaining a low effective oxide thickness.

(iii) Epitaxial growth of the nanotube structure allows the formation of highly abrupt source/channel and drain/channel junctions. This requires a low temperature epitaxial growth process to reduce unwanted dopant diffusion across the junctions.

Figure 3:
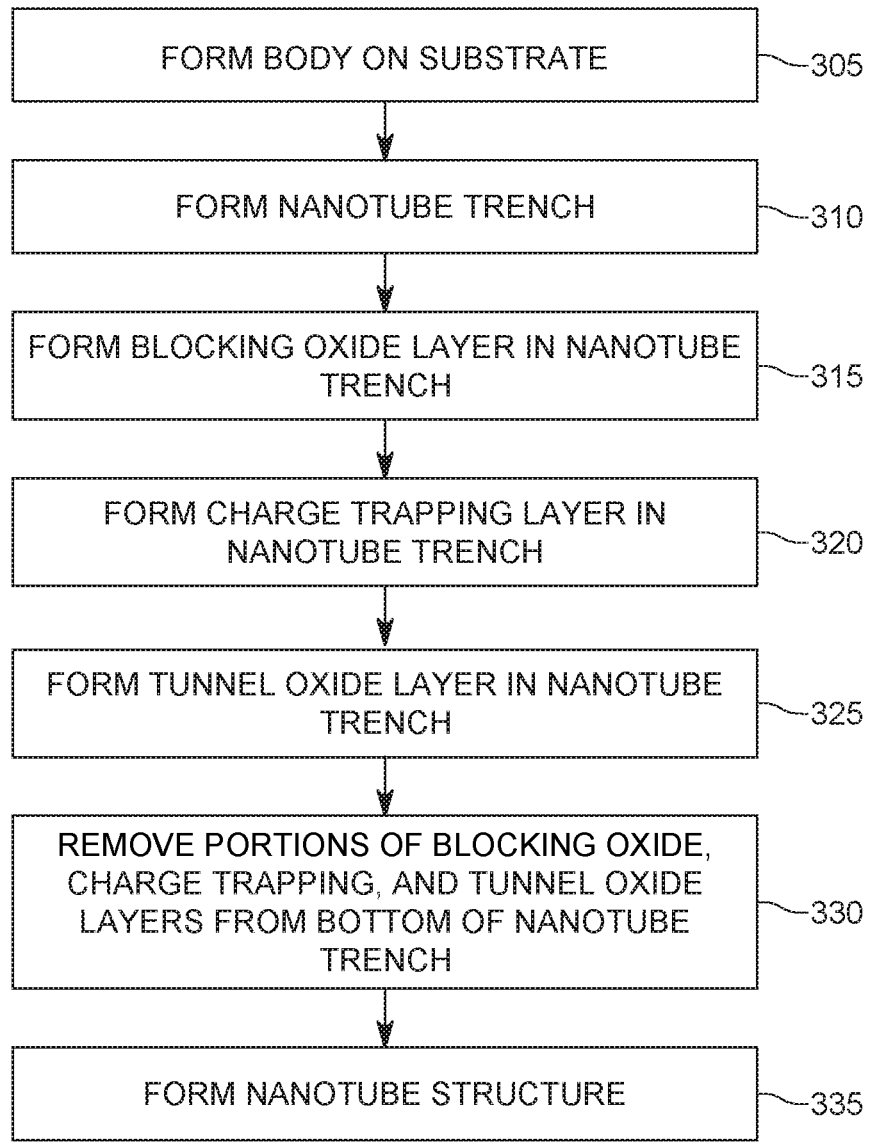
FIG. 3 illustrate a flowchart of a method of forming a nanotube field effect transistor memory cell according to embodiments.
Figure 4A:
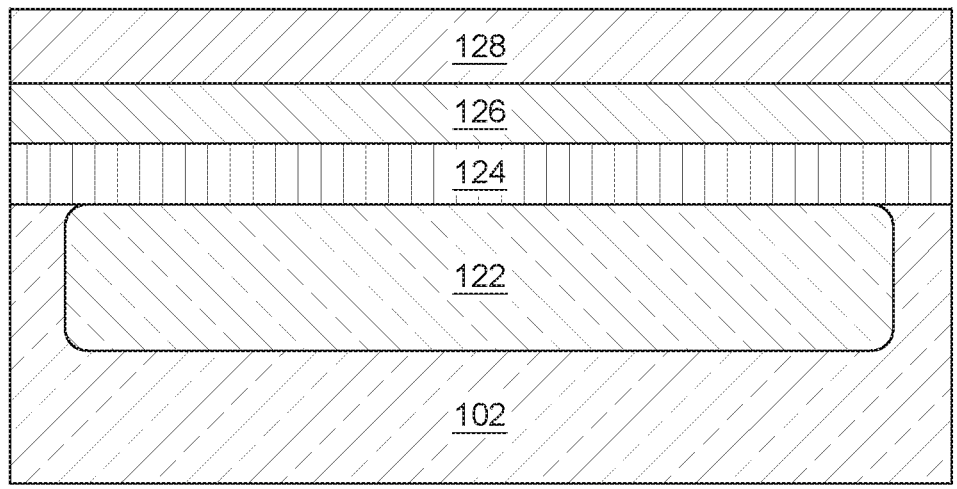
FIGS. 4A-4G illustrate the formation of a nanotube field effect transistor memory cell according to embodiments.

Referring initially to FIG. 3 and FIG. 4A, a body 104A, 104B is formed on a substrate 102 (step 305). The body 104A, 104B comprises plural layers 124-128. Specifically, a first dielectric layer 124 is formed on the substrate 102 on top of a heavily doped well 122. In an embodiment, the first dielectric layer 124 is a low-K silicon dioxide ($SiO_2$) layer having a thickness of, for example, 45 nm. A polysilicon layer 126, which functions as the gate layer, is then formed on the first dielectric layer 124. The polysilicon layer 126 has n++ heavy doping that is achieved using phosphorus-oxyl-chloride ($POCL_3$), which is a doping technique that produces a nearly uniform doping profile. A second dielectric layer 128 is formed on the polysilicon layer 126. In an embodiment, the second dielectric layer 128 is a low-K silicon dioxide ($SiO_2$) layer having a thickness of, for example, 20 nm.

Figure 4B:
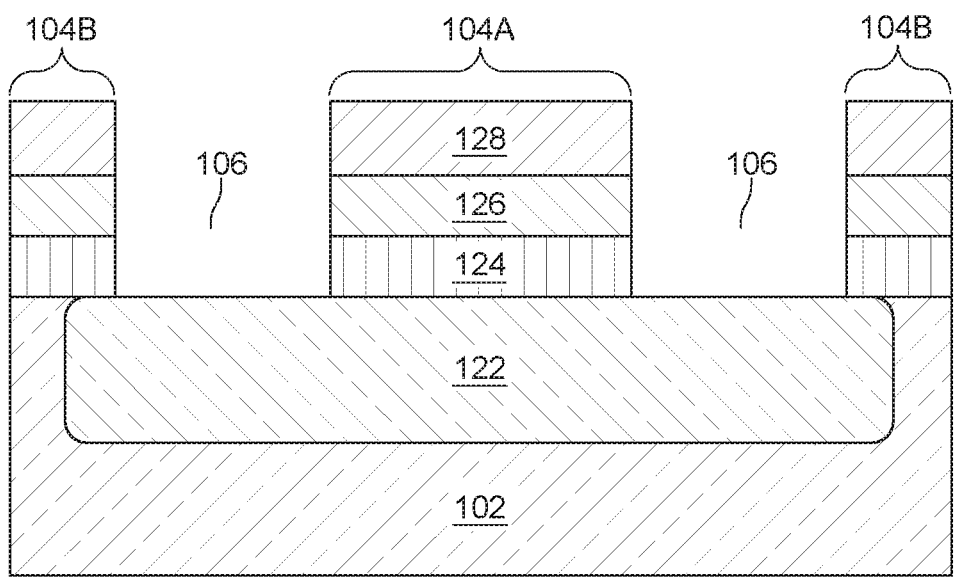

As illustrated in FIG. 4B, a nanotube trench 106 is then formed vertically into the body 104A, 104B to separate the body 104A, 104B into an outer body 104B and inner body 104A (step 310), which can be achieved by etching. This is a sensitive step in the method because it defines the minimum possible nanotube thickness that can be achieved. For example, using a 100 keV electron beam lithography and a diluted (1:1) positive resist (ZEP520A: Anisole), a minimum feature size of 50 nm can be achieved for the nanotube trench 106. This step achieves a highly vertical trench 106 etched in the oxide/poly-silicon/oxide gate structure and also minimizes surface damage on the silicon seed substrate 102.

To obtain these features, a reactive ion etcher (RIE) can be employed. Highly directional transport of reactive ion gases ($Cl_2$/HBr for Si; $CF_4$/$CHF_3$ for oxides and nitrides) combined with a noble carrier gas plasma (Ar) can be used to obtain the vertical nanotube trench 106. This process step takes advantage of the vertical nitride-based spacer isolation in classical planar MOSFETs, where traditionally, they have been used to isolate the gate from the source and drain regions. In an embodiment, the nanotube trench has a thickness (i.e., the measurement in the horizontal direction) of, for example, 50 nm or less and depth (i.e., the measurement in the vertical dimension) of, for example, 100 nm or less.

Figure 4C:
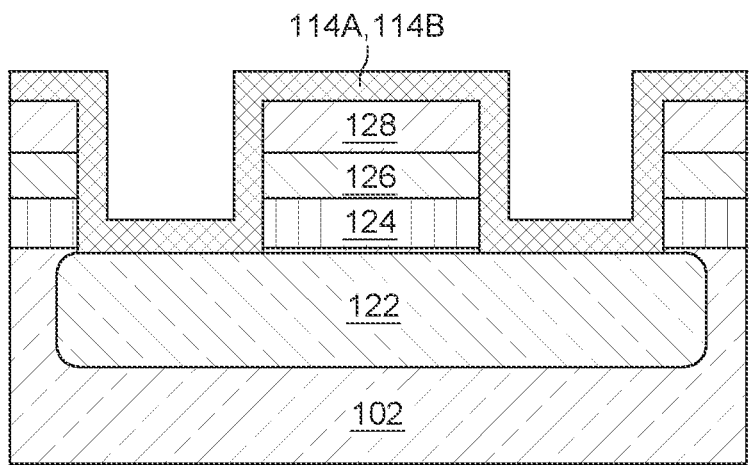
Figure 4D:
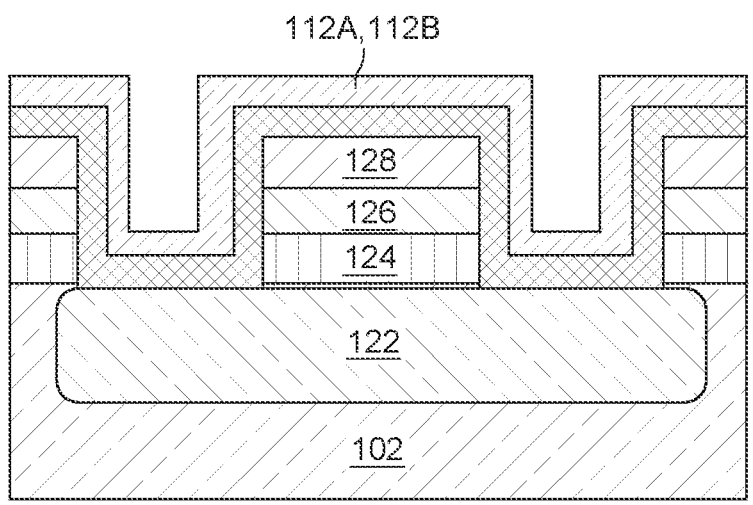
Figure 4E:
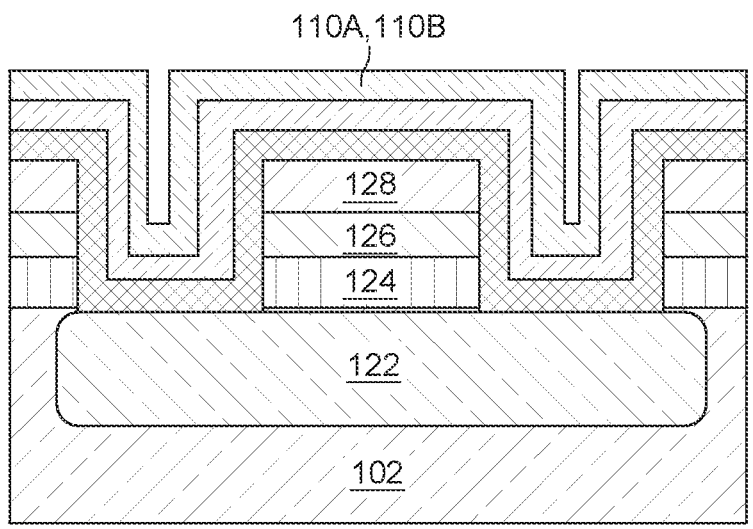

Turning now to FIG. 4C, a blocking oxide layer 114A, 114B is formed in the nanotube trench 106 (step 315). A charge trapping layer 112A, 112B is formed adjacent to the blocking oxide layer 114A, 114B in the nanotube trench 106 (step 320), which is illustrated in FIG. 4D. Referring now to FIG. 4E, a tunnel oxide layer 110A, 110B is formed adjacent to the charge trapping layer 112A, 112B in the nanotube trench 106 (step 325).

Figure 4F:
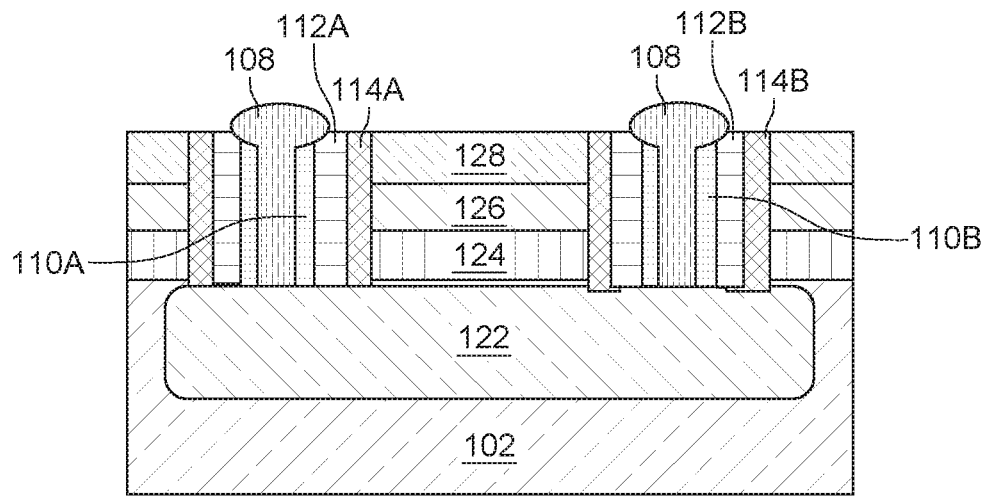

The portions of the blocking oxide layer 114A, 114B, charge trapping layer 112A, 112B, and tunnel oxide layer 110A, 110B that are on the substrate 102 in the nanotube trench 106 are then removed (step 330) and a nanotube structure 108 is then formed adjacent to the tunnel oxide layer 110A, 110B in the nanotube trench 106 (step 335), as illustrated in FIG. 4F. The removal of the blocking oxide layer 114A, 114B, charge trapping layer 112A, 112B, and tunnel oxide layer 110A, 110B that are on the substrate 102 in the nanotube trench 106 can be achieved, for example, using an inductively coupled plasma reactive ion etching tool.

The nanotube structure 108 is formed so that it has a source region 116 on the substrate 102, a channel region 118 on the source region 116, and a drain region 120 on the channel region 118. This can be achieved using, for example, silicon selective epitaxial growth (SEG). Epitaxy is the process of growing crystalline semiconducting materials from a seed substrate. Although, there are several types of this process, homo and hetero epitaxy are the two dominant processes for growing group-IV and III-V semiconductors. Homoepitaxy deals with material growth with similar crystal structure as the seed substrate (silicon, germanium) while heteroepitaxy is used for growing dissimilar materials (such as InAs, InGaAs). Of the two processes, silicon epitaxy has been widely-used for CMOS. In the past, as classical planar transistors where scaled down, the implanted source and drain junctions became very shallow and this led to the term 'ultra-shallow-junctions'. Such shallow junctions increase the contact access resistance leading to poor drive current performance. To overcome this, selective silicon epitaxy can be used to 'raise' the source/drain regions. This CMOS technique can be adapted here to form the nanotube source, channel and drain regions. Epitaxy is a very sensitive bottom-up growth process that is highly susceptible to minute changes in process conditions.

Thus, the formation of the nanotube structure 108 can be achieved in a cold-wall rapid thermal chemical vapor deposition chamber (RTCVD) with $SiH_2Cl_2$ (Dichlorosilane—DCS) and $H_2$ as the source gas. For n-type doping, diluted $PH_3$ (100 ppm in He) was utilized as the source gas. P-type epitaxial doping may also be used.

The formation of the nanotube structure 108 can be implemented in using two sub-steps. The first sub-step can employ a low-temperature growth of a buffer silicon layer (around 600° C.) to heal any RIE-induced surface damage from the substrate 102. At such a low temperature, the deposition rate is around 0.5 nm/min. After about 5 nm of silicon buffer layer growth, the second sub-step follows as the temperature is ramped up to 700° C. and the growth proceeds at a rate of 1 nm/min. In both sub-steps, the deposition pressure can be, for example, 150 mTorr, with DCS flow rate of 30 sccm and hydrogen flow rate of 180 sccm. Doping in the source region 116 and the drain region 120 can be achieved, for example, by a dopant source gas flow rate between 112.5 sccm-142.5 sccm of $PH_3$. In non-epitaxial growth, single crystal silicon is formed on the silicon substrate 102 while polycrystalline silicon nucleates on dielectrics such as $SiO_2$ and $Si_3N_4$. Silicon nucleation and further deposition on $SiO_2$ is comparatively much slower than on silicon. Using $SiH_2Cl_2+H_2$ source gas chemistry provides an inherent HCl content that takes advantage of the delayed nucleation times to effectively remove any silicon growth on oxide-based dielectrics, leading to complete selective epitaxy in oxide patterned trenches.

Traditionally, ion implantation, which involved accelerated bombardment of dopant species such as As, P, B etc., has been used to heavily dope the source and drain regions. In the planar transistor topology, achieving retrograde steep doping profiles became more challenging, especially when dealing with ultra-shallow junctions. Furthermore, once the dopants have been implanted, a very high thermal budget drive-in anneal (flash anneal, laser anneal, spike anneal) is required to 'activate' or move them to their appropriate low energy substitutional lattice sites. Additionally, ion-implantation is a damage-inducing process that amorphizes the single crystal silicon. Because of this, the CMOS industry now uses pre-amorphization molecular carbon implants to deliberately damage the surface before ion-implantation as a damage-control measure.

In-situ epitaxial doping has been explored in the past to achieve very steep junctions. This process offers several potential advantages over conventionally used ion-implantation. First, doped epitaxial growth occurs only when there is dopant source gas flow. It becomes very easy to create very steep and precisely aligned doping junctions leading to minimized parasitic capacitances and resistances due to underlap/overlap. Second, in-situ doping places dopants in their appropriate substitutional sites in the silicon crystal lattice without the need for activation anneal. As discussed earlier, diluted $PH_3$ (100 ppm in He) is used as the dopant source gas for in-situ doping of the source and drain regions.

In one application, one doping profile with the largest separation between source/drain regions and channel region doping levels may be obtained with a $PH_3$ flow rate of 142.3 sccm and epitaxial growth temperatures of 720° C. in the source and drain regions 116 and 120 and 680° C. in the "intrinsic—i" channel region 118 with a maximum doping concentration of about $2\times10^{20}$ cm$^{-3}$ and a minimum doping concentration of $4\times10^{19}$ cm$^{-3}$ respectively. Higher $PH_3$ flow rates were used to achieve larger separation, but due to process boundaries, the maximum achievable can be approximately 5 times.

Figure 4G:
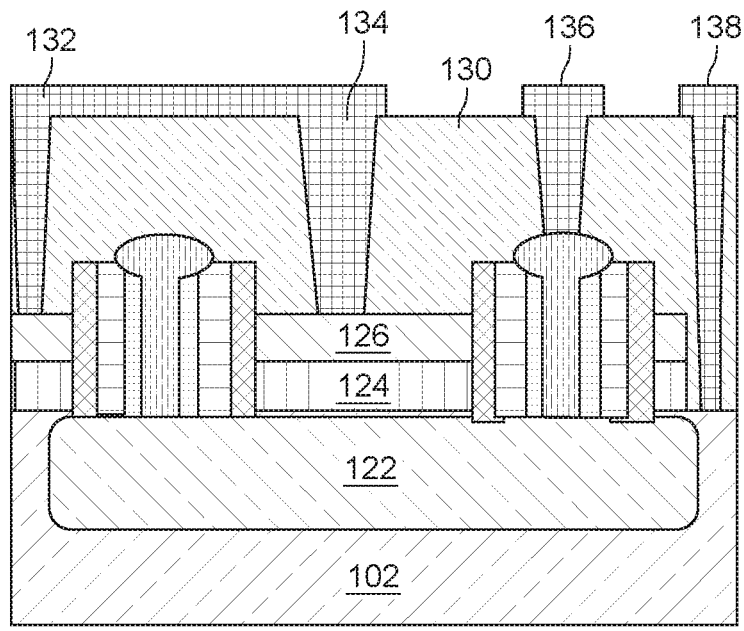

Referring now to FIG. 4G, a protective layer 130 is then formed on top of the body 104A, 1048 and the nanotube structure 108. The inner body 104A comprises a core gate and the outer body 1048 comprises a shell gate. A shell gate contact 132 is formed so that it passes through the protective layer 130 and is electrically coupled to the shell gate. A core gate contact 134 is formed so that it passes through the protective layer 130 and is electrically coupled to the core gate and to the shell gate contact 134. A drain contact 136 is formed so that it passes through the protective layer 130 and is electrically coupled to the nanotube structure 108. Finally, a source contact 138 is formed so that it passes through the protective layer 130 and electrically coupled to the substrate 102.

The details provided above with regard to the method are for illustrative purposes. Those skilled in the art would understand that the materials and various conditions (e.g., pressure, temperature, etc.) may be changed to still obtain the memory cell 100. For example, the nanotube trench 108 may be patterned using an ebeam lithography tool, and the source/channel/drain regions may be grown by selective epitaxy.

Figure 5:
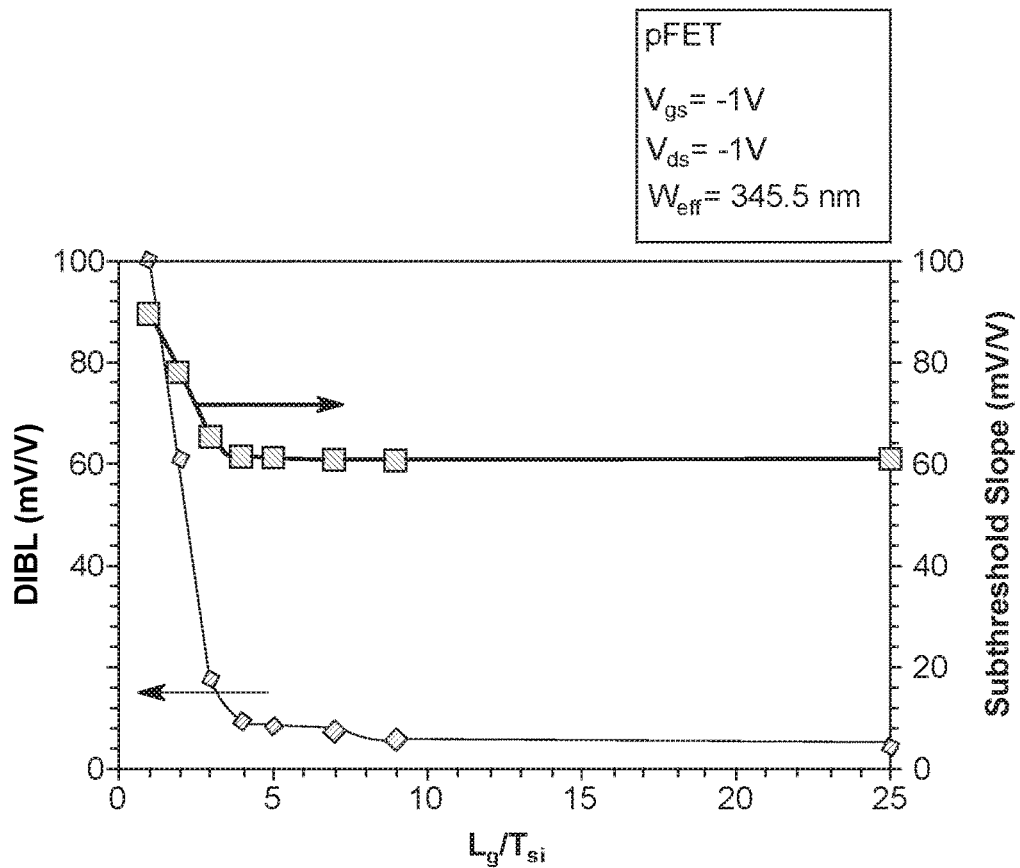
FIG. 5 illustrates a graph of short-channel effect of a nanotube field effect transistor memory cell according to embodiments.
Figure 6:
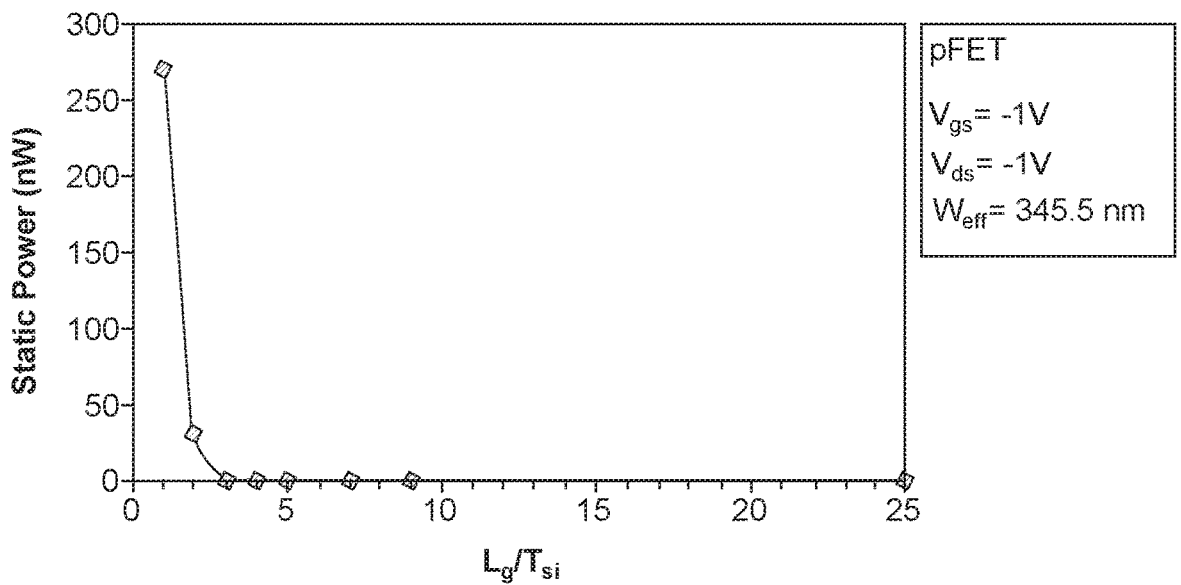
FIG. 6 illustrates a graph of the change in the static power versus the change in the ratio of the gate thickness ($L_g$) versus the thickness of the substrate ($T_{si}$) according to embodiments.

The performance of a memory cell 100 was evaluated with a gate to source voltage of −1 V, drain to source voltage of −1V, and an effective width $W_{\mathit{eff}}$ of the memory cell 100 of 345.5 nm (which includes the widths of the inner and outer gates, width of the oxides, and the nanotube region), the results of which are illustrated in the graphs of FIGS. 5 and 6. FIG. 5 is a graph illustrating the short-channel effect. Specifically, the graph shows the change in the drain-induced barrier lowering (lower curve) and the change in the subthreshold slope (upper curve) due to changes in the ratio of the gate thickness ($L_g$) versus the thickness of the substrate ($T_{si}$). As illustrated, in order to obtain a lower drain-induced barrier lowering with a small gate length, the thickness of the substrate should be optimized, which can be achieved using the results in this figure.

FIG. 6 illustrates a graph of the change in the static power versus the change in the ratio of the gate thickness ($L_g$) versus the thickness of the substrate ($T_{si}$). As illustrated, in order to obtain a small subthreshold slope with a small gate length, the thickness of the substrate should be optimized, which can be achieved using the results in this figure.

The disclosed embodiments provide silicon nanotube, field effect-transistor-based memory cells, and memory arrays containing such memory cells. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A memory cell, comprising:
a substrate having a doped well;
a body including plural layers, the body having an inner body and an outer body and the body being formed on top of the substrate;
a nanotube trench formed vertically in the body and extending to the substrate; and
a nanotube structure formed in the nanotube trench, the nanotube structure including a source region, a channel region, and a drain region,
wherein the nanotube trench divides the body into the inner body and the outer body and the nanotube structure is mechanically separated from the inner body and the outer body by a tunnel oxide layer, a charge trapping layer, and a blocking oxide layer,
wherein each of the source region, the channel region, and the drain region has entire lateral sides in contact with the tunnel oxide layer, and
wherein the source region is located directly on the doped well.

2. The memory cell of claim 1, wherein
the tunnel oxide layer is arranged between the charge trapping layer and the nanotube structure, and
the blocking oxide layer is arranged between the charge trapping layer and the inner and outer bodies.

3. The memory cell of claim 2, wherein
the tunnel oxide layer vertically surrounds the nanotube structure,
the charge trapping layer vertically surrounds the tunnel oxide layer; and
the blocking oxide layer vertically surrounds the charge trapping layer.

4. The memory cell of claim 2, wherein the tunnel oxide and blocking oxide layers comprise high-K dielectric oxides.

5. The memory cell of claim 1, wherein the nanotube structure comprises:
the source region formed on the doped well of the substrate;
the channel region formed on the source region; and
the drain region formed on the channel region.

6. The memory cell of claim 1, wherein the doped well is arranged in a region adjacent to the nanotube structure.

7. The memory cell of claim 1, wherein the inner body comprises a core gate and the outer body comprises a shell gate.

8. The memory cell of claim 7, further comprising:
a protective layer arranged on top of the body and nanotube structure.

9. The memory cell of claim 8, further comprising:
a shell gate contact passing through the protective layer and electrically coupled to the shell gate; and
a core gate contact passing through the protective layer and electrically coupled to the core gate and to the shell gate contact.

10. The memory cell of claim 8, further comprising:
a drain contact passing through the protective layer and electrically coupled to the nanotube structure; and
a source contact passing through the protective layer and electrically coupled to the substrate.

11. A memory, comprising:
a memory controller arranged on a substrate; and
a plurality of memory cells arranged in an array on the substrate and electrically coupled to the memory controller, wherein each of the plurality of memory cells comprises,
a body including plural layers, the body being formed on top of the substrate and the substrate including a doped well;
a nanotube trench formed vertically in the body and extending to the substrate; and
a nanotube structure formed in the nanotube trench, the nanotube structure including a source region, a channel region, and a drain region,
wherein the nanotube trench divides the body into an inner body and an outer body and the nanotube structure is mechanically separated from the outer body by a tunnel oxide layer, a charge trapping layer, and a blocking oxide layer,
wherein each of the source region, the channel region, and the drain region has entire lateral sides in contact with the tunnel oxide layer, and
wherein the source region is located directly on the doped well.

12. The memory of claim 11, wherein in each of the plurality of memory cells:
the tunnel oxide layer vertically surrounds the nanotube structure;
the charge trapping layer vertically surrounds the tunnel oxide layer; and
the blocking oxide layer vertically surrounds the charge trapping layer.

13. The memory of claim 11, wherein the nanotube structure of each of the plurality of memory cells comprises:
the source region formed on the doped well of the substrate;
the channel region formed on the source region; and
the drain region formed on the channel region.

14. The memory of claim 11, wherein the doped well is arranged in a region adjacent to the nanotube structure of each of the plurality of memory cells.

15. The memory of claim 11, wherein for each of the plurality of memory cells, the inner body comprises a core gate and the outer body comprises a shell gate.

* * * * *